(12) United States Patent
Issa et al.

(10) Patent No.: US 6,678,198 B2
(45) Date of Patent: Jan. 13, 2004

(54) PSEUDO DIFFERENTIAL SENSING METHOD AND APPARATUS FOR DRAM CELL

(75) Inventors: Sami Issa, Phoenix, AZ (US); Morteza Cyrus Afghahi, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 211 days.

(21) Appl. No.: 09/921,606

(22) Filed: Aug. 3, 2001

(65) Prior Publication Data

US 2002/0131312 A1 Sep. 19, 2002

Related U.S. Application Data

(60) Provisional application No. 60/276,710, filed on Mar. 16, 2001.

(51) Int. Cl.$^7$ .............................. G11C 7/14; G11C 7/12
(52) U.S. Cl. .................. 365/207; 365/210; 365/187; 365/189.07
(58) Field of Search ................................. 365/207, 149, 365/187, 208, 210, 230.03, 189.07

(56) References Cited

U.S. PATENT DOCUMENTS

| | | |
|---|---|---|
| 4,339,766 A | 7/1982 | Rao |
| 4,491,858 A | 1/1985 | Kawamoto |
| 5,764,581 A | 6/1998 | Nix |
| 5,926,428 A * | 7/1999 | Rao ............................ 365/207 |
| 6,198,681 B1 * | 3/2001 | Forbes ........................ 365/205 |
| 6,418,044 B1 * | 7/2002 | Laurent ....................... 365/149 |

OTHER PUBLICATIONS

Foss, R.C., et al., "Re–Inventing the DRAM For Embedded Use: A Compiled, Wide–Databus DRAM Macrocell with High Bandwidth and Low Power," IEEE 1998 Custom Integrated Circuits Conference; 1998; pp. 283–286; Issue 0–7803–4292–5/97; IEEE.

* cited by examiner

Primary Examiner—Michael S. Lebentritt
Assistant Examiner—Jung H. Hur
(74) Attorney, Agent, or Firm—Christie, Parker & Hale, LLP

(57) ABSTRACT

Present invention describes an efficient implementation of differential sensing in single ended DRAM arrays. According to one embodiment of the present invention, a respective local sense amplifier compares the accessed memory cell data with a dummy cell data in the opposite or adjacent block of the accessed block that is connected to a respective local bit line in the opposite block, amplifies the result of the comparison and puts the data on a global bit line. In one embodiment, the invention is process and temperature invariant using reference method and means for canceling cross coupling between read lines and write lines.

29 Claims, 15 Drawing Sheets

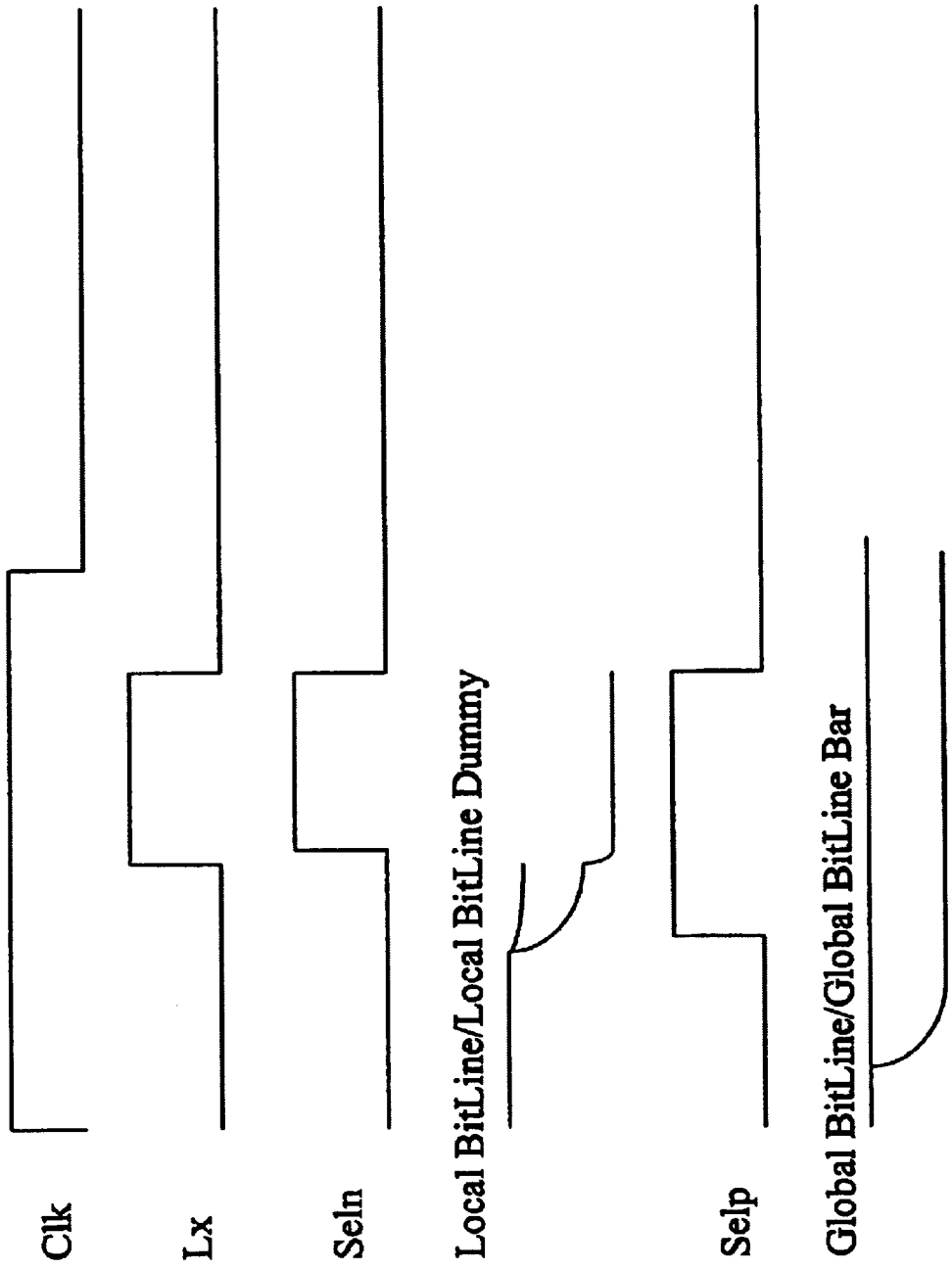

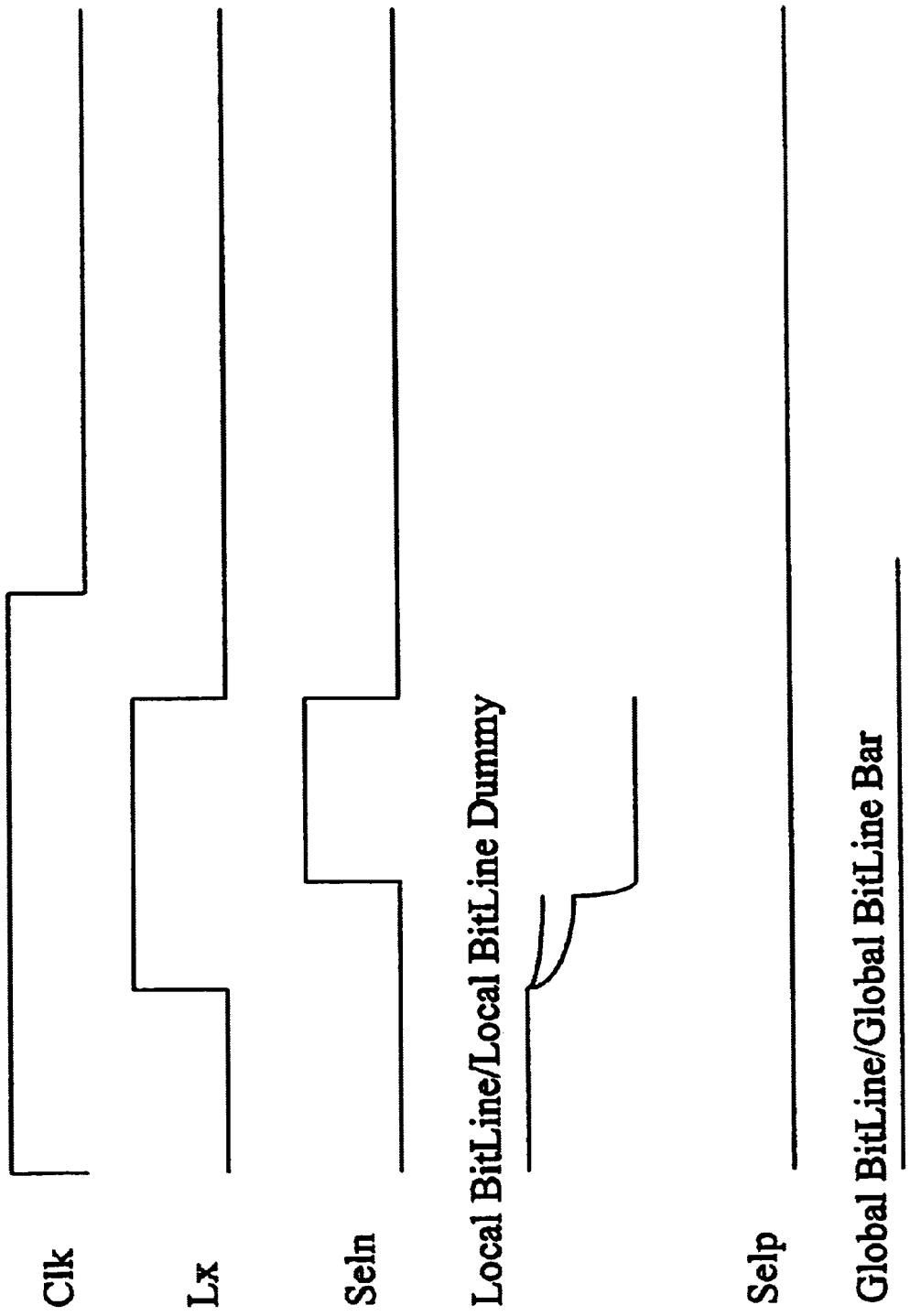

PSEUDO DIFFERENTIAL SENSING METHOD AND APPARATUS FOR DRAM CELL

CROSS-REFERENCE TO RELATED APPLICATIONS

This patent application claims the benefit of the filing date of U.S. Provisional Patent Application Ser. No. 60/276,710, filed Mar. 16, 2001 and entitled "PSEUDO DIFFERENTIAL SENSING METHOD AND APPARATUS FOR DRAM CELL"; the entire contents of which are hereby expressly incorporated by reference.

FIELD OF THE INVENTION

The present invention relates to dynamic random access memories (DRAMs). More specifically, the invention relates to a differential sensing method and apparatus for DRAMs.

BACKGROUND OF THE INVENTION

RAM devices have become widely accepted in the semiconductor industry. Furthermore, system-on-chip (SOC) devices typically include internal RAM for storage of information such as instructions and/or data. Internal memory blocks in an SOC device typically occupy substantial chip area of an integrated circuit (IC) chip that contains the SOC device. For example, internal memory blocks may occupy as much as about 70% of the IC chip area of an SOC device. The configuration of internal memory in SOC devices are generally similar to the configuration of memory in individual memory chips.

Each block of RAM includes a number of memory cells. Each memory cell typically stores one bit of information. Typical RAM blocks have capacity to store anywhere from thousands to millions of bits of data. Since vast numbers of memory cells are used to store information in RAM blocks, the size of RAM blocks depends, to large extent, on the size of each memory cell.

Memory cells in dynamic random access memory (DRAM) blocks typically require less number of transistors per bit than cells in a static random access memory (SRAM). For example, some DRAM blocks contain memory cells with three transistor (3-T) per bit, while other DRAM blocks contain memory cells with one transistor (1-T) per bit. Therefore, DRAM blocks of SOC devices and DRAM chips are typically smaller than SRAM blocks with similar information storage capacity.

However, unlike the differential SRAM cell structure that lends itself to differential sensing implementation, a single ended DRAM cell structure does not normally lend itself to differential sensing implementation. Differential sensing is the preferred sensing method due to its noise immunity, robustness and speed.

Therefore, there is a need for a DRAM structure that takes less area, but is capable of an advantageous differential sensing that is less prone to process and temperature variations.

SUMMARY OF THE INVENTION

Present invention describes a new design and architectural arrangement that allows for efficient implementation of differential sensing in single ended DRAM arrays. According to one embodiment of the present invention, a respective local sense amplifier compares the accessed memory cell data with a dummy cell data in the opposite or adjacent column of an accessed block, amplifies the result of the comparison and puts the data on a global bit line. In one embodiment, the invention is process and temperature invariant using reference method and means for canceling cross coupling between read lines and write lines. In one embodiment, a relative simple 4-transistor sense amplifier is augmented with two PMOS transistors to provide a fast and efficient sense amplifier that limits the voltage swing in the respective global bit lines for both read and write cycles. Additionally, a single transistor current sink, as part of the sense amplifier, provides layout flexibility and scalability and better voltage swing and speed.

In one aspect, the present invention discloses a DRAM with differential sensing means comprising: a top block of data cells including a plurality of data cell subsets, wherein each of the data cell subsets is coupled to a respective top bit line; a bottom block of data cells including a plurality of data cell subsets, wherein each of the data cell subsets is coupled to a respective bottom bit line; a plurality of sense amplifiers positioned between the top block of data cells and the bottom block of data cells, each sense amplifier of the plurality of sense amplifiers is shared by a respective top bit line and a respective bottom bit line; a first replica memory cell with a portion of driving capability of a data cell, wherein the first replica memory cell turns on coupling a respective sense amplifier to a respective bottom bit line when a data cell in the top block of data cells is accessed; and a second replica memory cell with a portion of driving capability of a data cell, wherein the second replica memory cell turns on coupling a respective sense amplifier to a respective top bit line when a data cell in the bottom block of data cells is accessed.

In another aspect the present invention describes a method for differential sensing of a hierarchical DRAM. The DRAM includes a first block of data cells comprising a plurality of data cell arrays, and a second block of data cells comprising a plurality of data cell arrays, each of the data cell arrays includes a plurality of data cells, and a sense amplifier array positioned between the first block of data cells and the second block of data cells, each sense amplifier in the sense amplifier array shared by a respective data cell array in the first block and a respective data cell array in the second block. The method comprising the steps of: activating a first replica memory cell with a portion of driving capability of a data cell for connecting a respective sense amplifier to a respective data cell array in the second block when a data cell in the first block of data cells is accessed; and turning on a second replica memory cell with a portion of driving capability of a data cell for connecting a respective sense amplifier to a respective data cell array in the first block when a data cell in the second block of data cells is accessed.

BRIEF DESCRIPTION OF THE DRAWINGS

The objects, advantages and features of this invention will become more apparent from a consideration of the following detailed description and the drawings, in which:

FIGS. 11A–C are exemplary timing diagrams for read, write, and refresh operations respectively, according to one embodiment of the present invention.

DETAILED DESCRIPTION

Figure 1:
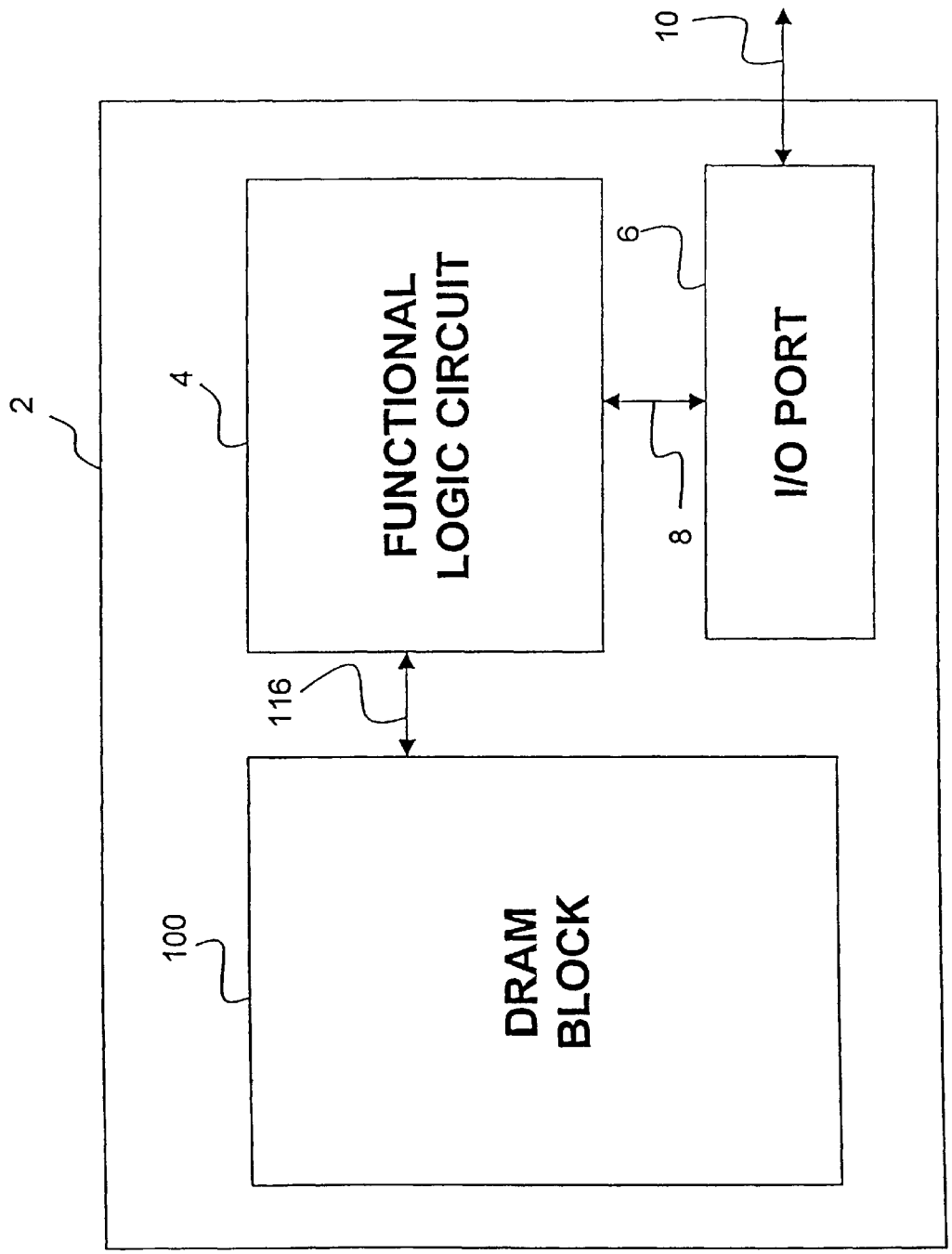
FIG. 1 is an exemplary block diagram of a system-on-chip (SOC) device that includes a dynamic random access memory (DRAM) block, according to one embodiment of the present invention.

FIG. 1 is a block diagram of a system-on-chip (SOC) device 2. The SOC device 2 preferably includes a functional logic circuit 4 for data processing. The functional logic circuit 4 preferably communicates with external devices using an I/O port 6 over an I/O interface 8. The I/O port 6 transmits and receives data to and from the external devices over an external interface 10. The SOC device 2 also includes a random access memory (DRAM) block 100. The DRAM block 100 may be used to store data and information for data processing by the functional logic circuit 4. The functional logic circuit preferably accesses the data and/or information used during data processing over a data bus 116.

For example, the SOC device 2 may be a high speed switch chip. In the high speed switch chip, the DRAM block 100 may typically store information regarding source and destination of data packets. In the high speed switch chip, the I/O port 6 may be a transceiver for receiving and transmitting the data packets. The functional logic circuit 4 in the high speed switch chip may be used to switch or route the incoming data packets to external devices based on the information stored in the DRAM block 100.

Figure 2:
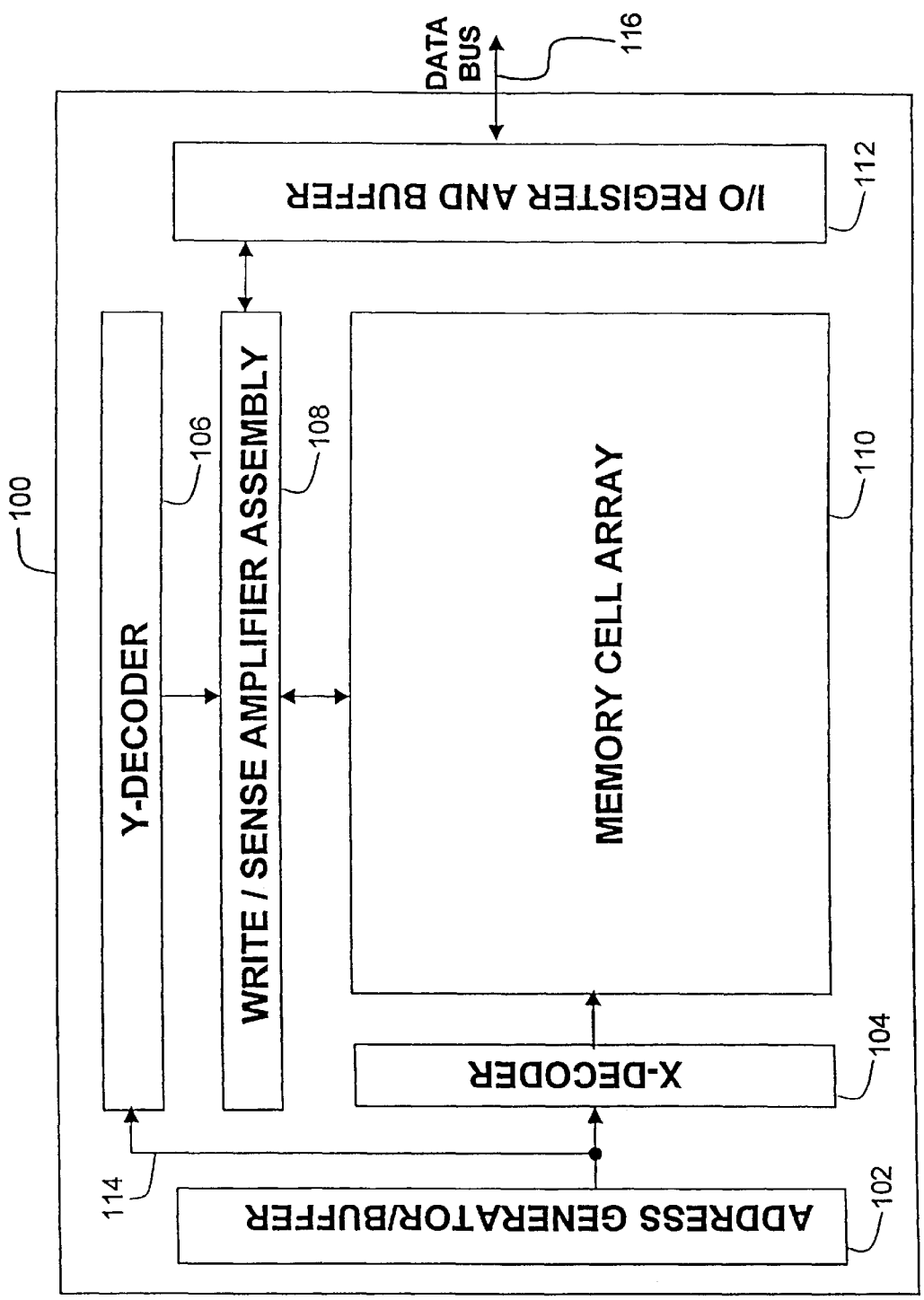
FIG. 2 is an exemplary block diagram of a RAM block of an SOC device or a RAM chip, according to one embodiment of the present invention.

FIG. 2 is an exemplary block diagram of the DRAM block 100. The DRAM block 100 may be used as a part of an SOC device as in FIG. 1, or as a part of an individual DRAM chip. The DRAM block 100 preferably includes a memory cell array 110. The memory cell array 110 includes a number of memory cells. The memory cells in the memory cell array 110 are organized into rows and columns.

The DRAM 100 also includes a write/sense amplifier assembly 108. The write/sense amplifier assembly 108 includes multiple write amplifiers and multiple sense amplifiers. The write amplifiers are used to write to the memory cells while the sense amplifiers are used to read contents of the memory cells. The DRAM block 100 preferably has one write amplifier and one sense amplifier per each column of the memory cell array.

The number of rows and columns of memory cells in the memory cell array 110 determines the information storage capacity of the DRAM block. The number of bits that the DRAM block 100 stores may range from hundreds to hundreds of millions or more. The DRAM block 100 also includes a Y decoder 106. The Y decoder 106 receives address signals and selects the columns of memory cells in the memory cell array for reading, writing and refreshing operations. In other words, the Y decoder 106 decodes the address signals to generate write and read bit line select signals to select columns in the memory cell array 110 for writing and reading, respectively.

The DRAM block 100 also includes an X decoder 104. The X decoder 104 is used to select rows of the memory cell array 110 for reading, writing and refreshing. The X decoder 104 receives address signals and decodes them to select one or more rows of the memory cell array. The DRAM block 100 also includes an address generator/buffer 102. The address generator/buffer 102 either generates addresses within the DRAM block or the addresses may be provided by a component or a device outside of the DRAM block. The address generator/buffer 102 provides the addresses 114 to the Y decoder 106 and the X decoder 104. The addresses 114 include an access address and a refresh address. The access address is used for normal memory cell access operations such as read and write. The refresh address is used for refreshing the memory cells.

The DRAM block 100 also includes an I/O register and buffer 112. The I/O register and buffer 112 is used to temporarily store data bits to be written to the memory cells during writing operations. The I/O register and buffer 112 is also used to temporarily store data bits that are read from the memory cells. The I/O register and buffer 112 interfaces the memory cell array 110 to a memory data bus 116 through the write/sense amplifier assembly 108.

Figure 3:
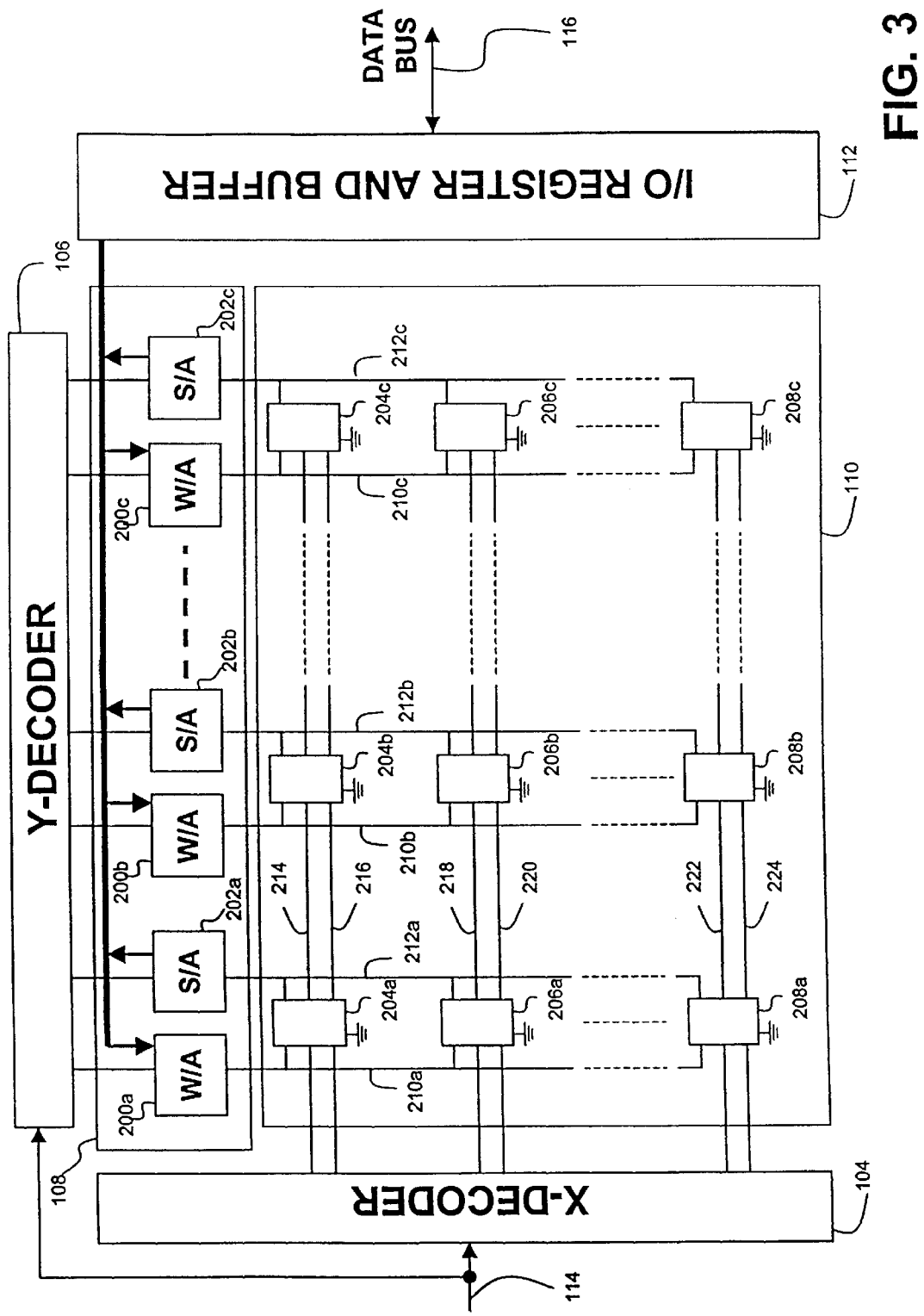
FIG. 3 is an exemplary block diagram that illustrates details of a sense amplifier assembly and a memory cell array, according to one embodiment of the present invention.

FIG. 3 is a block diagram that shows details of the memory cell array 110 and the write/sense amplifier assembly 108 in one embodiment of the present invention. Components of the memory cell array and the write/sense amplifier assembly, such as write amplifiers, sense amplifiers, memory cells, read bit lines, write bit lines, read select lines and write select lines, are shown in FIG. 3 for illustrative purposes only. The DRAM block of the present invention may include many more columns of memory cells and corresponding write amplifiers and sense amplifiers. In addition, the DRAM block may include many more rows of memory cells.

The write/sense amplifier assembly 108 includes multiple write amplifiers 200a, 200b and 200c. The write sense amplifier assembly 108 also includes multiple sense amplifiers 202a, 202b and 202c. Design and implementation of write amplifiers are well known to those with ordinary skill in the art. However, the present invention describes an accurate differential sense amplifier that operates independent of process and/or temperature variations across an IC chip.

In the one embodiment of the present invention, each of the memory cells in the memory cell array 110 is a 3-T cell that is associated with two bit lines, a write bit line and a read bit line. Each of the write bit lines is used to write to the associated memory cells. Each of the read bit lines is used to read from the associated memory cells. The write bit lines are coupled to the write amplifiers and the read bit lines are coupled to the sense amplifiers.

Memory cells 204a, 206a and 208a represent a first column of memory cells in the memory cell array 110. Memory cells 204b, 206b and 208b represent a second column of memory cells in the memory cell array 110. Memory cells 204c, 206c and 208c represent an mth column of memory cells in the memory cell array 110. Write and read bit lines 210a and 212a are coupled to the first column of memory cells. The write bit line 210a couples the write amplifier 200a to each of the memory cells 204a, 206a and 208a. The read bit line 212a couples the sense amplifier 202a to each of the memory cells 204a, 206a and 208a. Memory cells 204b, 206b and 208b are coupled to the write amplifier 200b and read amplifier 202b through a write bit line 210b and a read bit line 212b, respectively. Memory cells 204c, 206c and 208c are coupled to a write amplifier 200c and a read amplifier 202c through a write bit line 210c and a read bit line 212c, respectively. Each of the memory cells is coupled to ground.

The X decoder 104 receives and decodes the addresses 114, and provides read and write select signals through read and write select lines 214 and 216, respectively, to a first row of memory cells 204a, 204b and 204c. The X decoder 104 also provides read and write select signals through read and write select lines 218 and 220, respectively, to a second row of memory cells 206a, 206b and 206c. In addition, the X decoder 104 provides read and write select signals through read and write select lines 222 and 224 to an nth row of memory cells 208a, 208b and 208c.

The Y decoder 106 receives and decodes the addresses 114, and provides write and read bit line select signals to the write amplifiers for writing and sense amplifiers for reading, respectively. The read and write select signals from the X decoder and the write and read bit line select signals from the Y decoder are used to select memory cells for reading and writing.

Figure 4A:
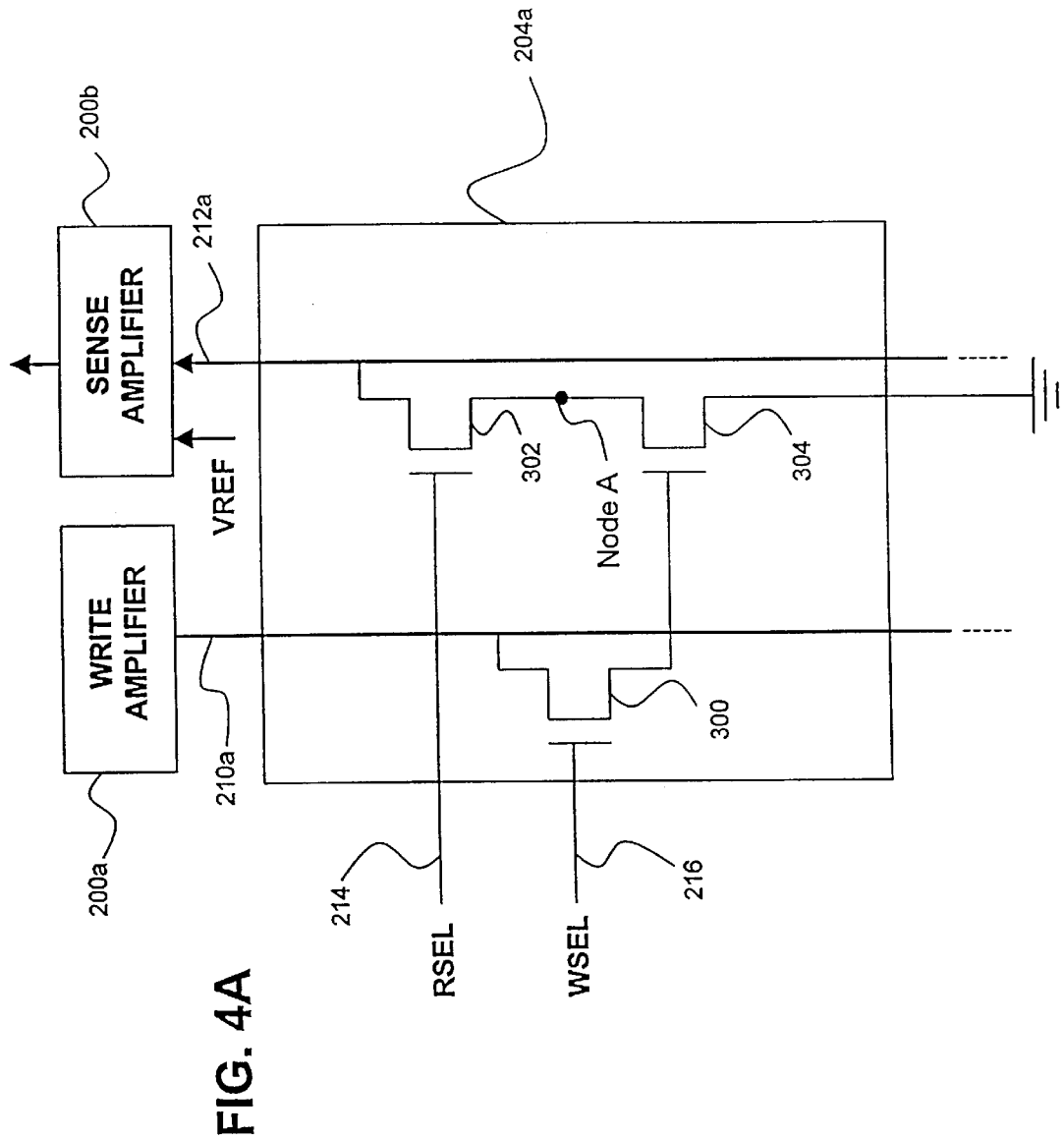
FIG. 4A is an exemplary detailed block diagram of a 3-T memory cell, according to one embodiment of the present invention.

FIG. 4A is an exemplary block diagram of a 3-T memory cell 204a. In one embodiment of the present invention, the transistors are NMOS transistors. The memory cell 204a is coupled to a write amplifier 200a and a sense amplifier 200b through a write bit line 210a and a read bit line 212a, respectively. The memory cell 204a is also coupled to a read select line 214 and a write select line 216. In one embodiment, the write amplifier 200a and the sense amplifier 200b may be embodied in one circuit.

The write select line 216 is coupled at a gate of a transistor 300. The drain of the transistor 300 is coupled to a write amplifier 200a over the write bit line 210a and the source of the transistor 300 is coupled to the gate of a transistor 304. The source of the transistor 304 is coupled to ground and its drain is coupled to the source of transistor 302 at node A. The read select line 214 is coupled to a gate of the transistor 302. The drain of the transistor 302 is coupled to the sense amplifier 200b over the read bit line 212a.

When the memory cell 204a is selected for writing, a logic high write select signal is provided at the gate of the transistor 300 over the write select line 216. Meanwhile, the write amplifier 200a provides the write bit line 210a with a data bit to be written to the memory cell 204a. With the logic high write select signal, the transistor 300 turns on, thus allowing the data bit to pass through the transistor 300 and be provided to the gate of the transistor 304.

If the provided data bit is a logic low data bit, the transistor 304 does not turn on, and the ground is not propagated to node A. On the other hand, if the data bit is a logic high data bit, the transistor 304 turns on. At this time, the gate of the transistor 304 is positively charged, and the transistor 304 stays on. In this case, since the source of the transistor 304 is coupled to ground, the voltage level at node A approaches ground. In other words, node A is pulled down to a logic low.

Since the write select signal and the read select signal are mutually exclusive, when the write select signal is logic high, the read select signal is logic low. Therefore, a logic low read select signal is provided at the gate of the transistor 302 over the read select line 214. Since the transistor 302 is an n-type transistor, it does not turn on, i.e., it turns off, when the logic low read select signal is applied at the gate.

For reading, prior to selecting the memory cell 204a for reading with the read select signal, the sense amplifier 200b pre-charges the read bit line 212a by coupling it to a high voltage, e.g., Vdd. Once the read bit line 212a is pre-charged to logic high, the high voltage is uncoupled from the bit line 212a. Thus, the read bit line 212a is floating at logic high.

When a logic high read select signal is provided at the gate of the transistor 302, the transistor 302 turns on, allowing the voltage at node A onto the read bit line 212a to be read by the sense amplifier 200b. At the same time, since the read select signal and the write select signal are mutually exclusive, the write select signal is logic low, and the transistor 300 is not turned on.

If the transistor 304 has been turned on through a write operation with a logic high data bit, the ground is propagated to node A and the pre-charged bit line 212a is pulled down to logic low during a subsequent read operation. Thus, the sense amplifier 200b reads logic low during the read operation. On the other hand, however, if the transistor 304 has not been turned on, ground is not propagated to node A, and the pre-charged bit line 212a remains at logic high. Thus, the sense amplifier 200b reads a logic high responsive to the written logic high data during the read operation. If the memory 204a is in a top column, the data read from the memory cell 204a is compared with a replica memory cell in the bottom column, before the data is sent out. If the memory 204a is in a bottom column, the data read from the memory cell 204a is compared with a replica memory cell in the top column. The replica cells are preferably within the sense amplifier.

Figure 4B:
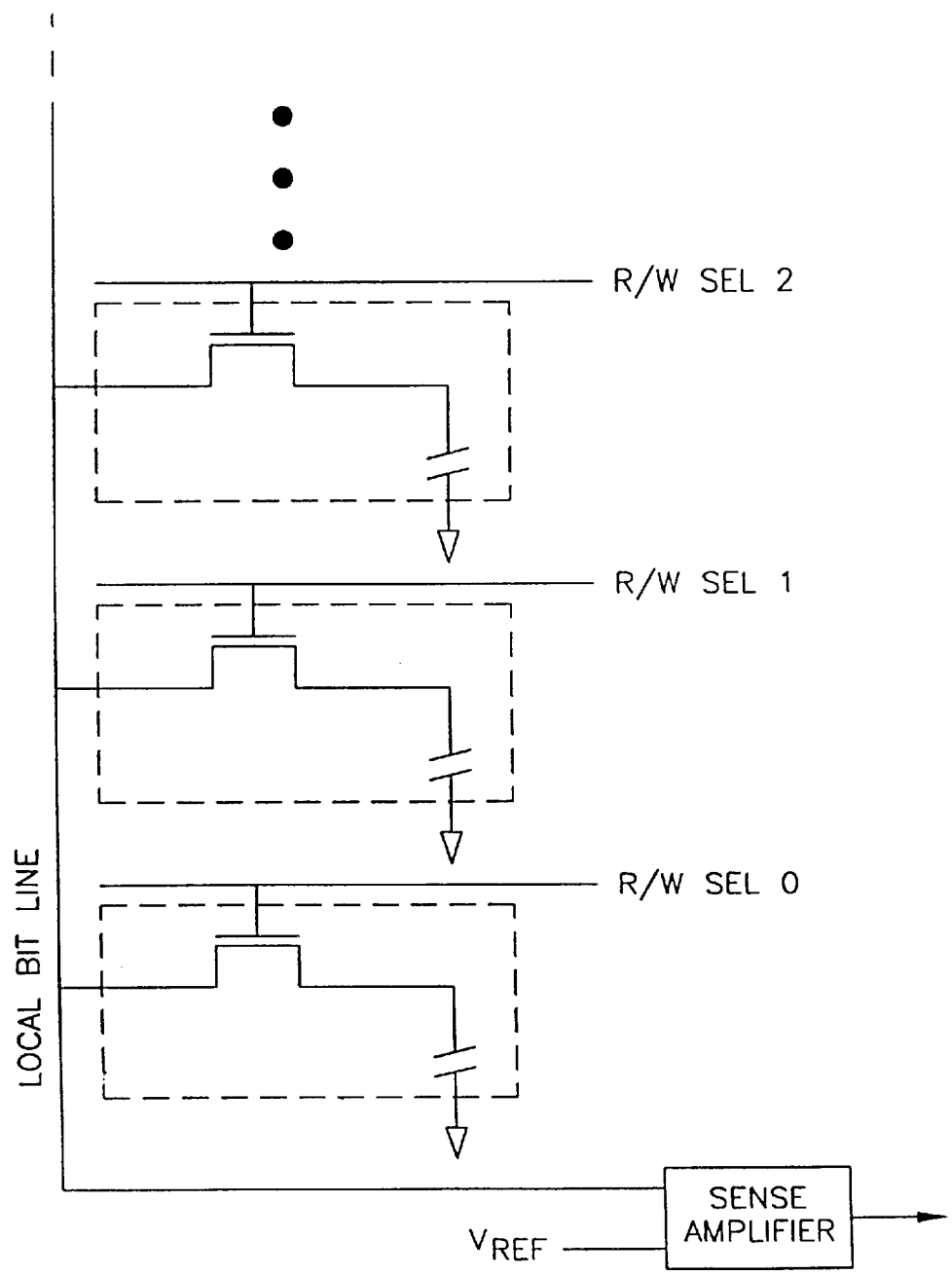
FIG. 4B is an exemplary detailed block diagram of a 1-T memory cell, according to one embodiment of the present invention.

Similarly, three exemplary 1-T memory cells are shown in FIG. 4B. Each capacitor holds a charge corresponding to a written data, respectively. Each bit line carries data into and out of the respective cell. Each transistor switch is enabled by the respective word select line which is a function of the row address. The transistor switch is situated such that its source is connected to the capacitor, its drain is connected to the bit line, and its gate is connected to the word select line. As shown in FIG. 4B, the 1-T cell design has only one line for both write and read signals.

In a typical operation, the sense amplifier is a differential amplifier with one input connected to the bit line and the other input connected to a reference voltage Vref. If the voltage on the bit line is larger than the Vref, the differential sense amplifier outputs a logic high. Likewise, if the voltage on the bit line is smaller than the Vref, the differential sense amplifier outputs a logic low.

Figure 5:
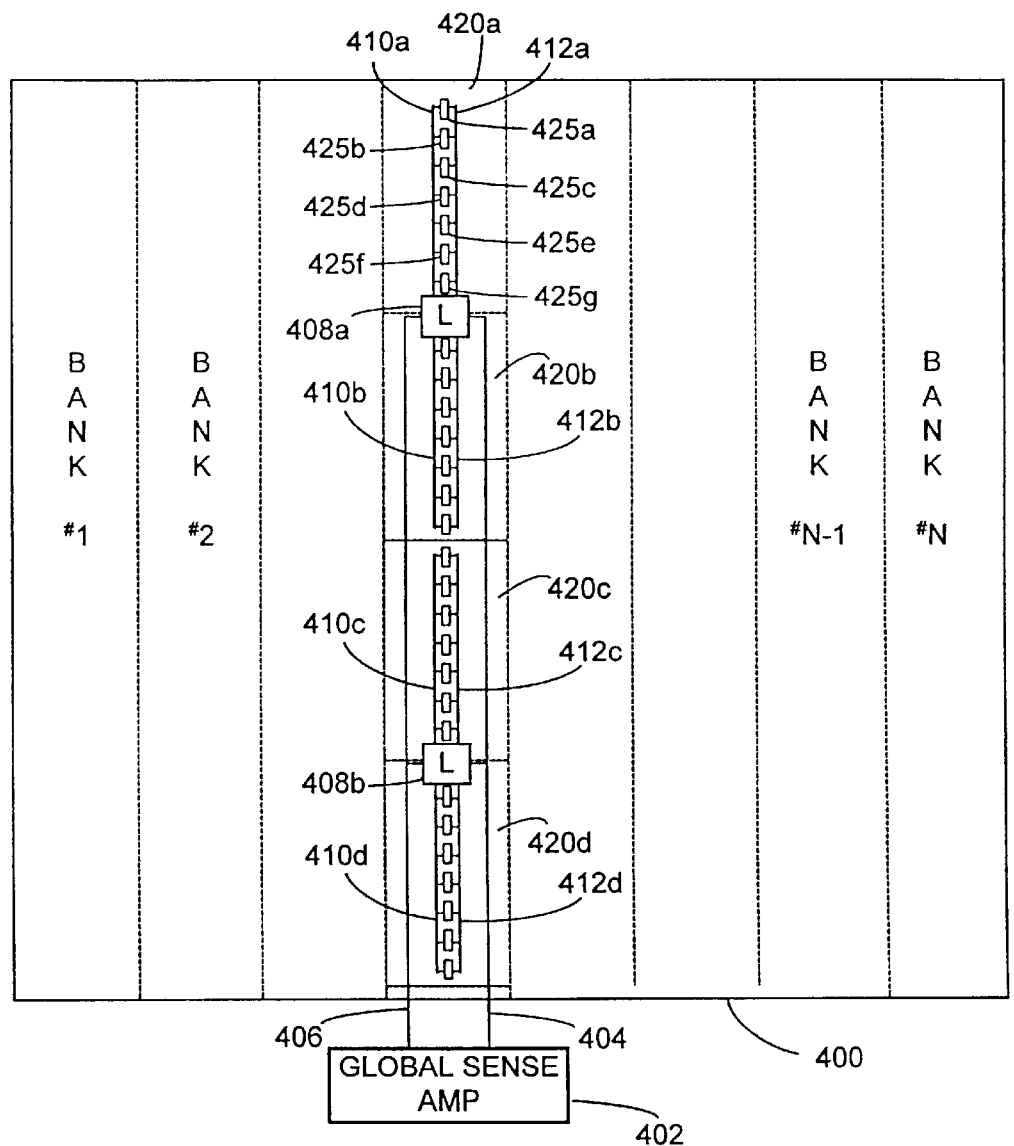
FIG. 5 is an exemplary block diagram of a hierarchical memory module using local bit line sensing shared by a top and a bottom memory portion, according to one embodiment of the present invention.

FIG. 5 illustrates a memory structure 400 formed by coupling multiple cooperating constituent blocks 420a–e, with each pair of the blocks 420a–e sharing a respective local sense amplifier 408a–b. Each memory block 420a–d is composed of a predefined number of memory cells 425a–g.

Memory cells 425a–g are coupled with respective local sense amplifier 408a, b via local bit lines 410a–d, 412a–d. As shown, memory blocks 420a–d are paired with a single sense amplifier 408a, b. A global sense amplifier 402 is coupled with local sense amplifiers 408a, 408b. Because local sense amplifier 408a senses only the respective top local bit line 410a and bottom local bit line 410b, of the respective memory blocks 420a and 420b, the amount of time and power necessary to precharge local bit lines 410a–e are substantially reduced. Only when local sense amplifier 408a senses a signal on respective local lines 410a and 410c, does it provide a signal to global sense amplifier 402. This architecture adds flexibility and scalability to a memory architecture design because the memory size can be increased by adding locally-sensed memory blocks such as 420a–e. Each of the respective memory banks 1-N include the respective memory blocks 420a–e and all words within the same block share a common set of local bit lines.

In a normal access cycle, for example in a read operation, only one row from a bank is selected, data is placed onto the local bit line. According to one embodiment of the present invention, a respective local sense amplifier compares the accessed data with a dummy cell data connection to the opposite column of the accessed block, amplifies the result of the comparison and puts the data on a global bit line which is shared by all the blocks in a memory bank. The global bit line then may input the data into a global sense amplifier which in turn, outputs the data from the memory.

Figure 6:
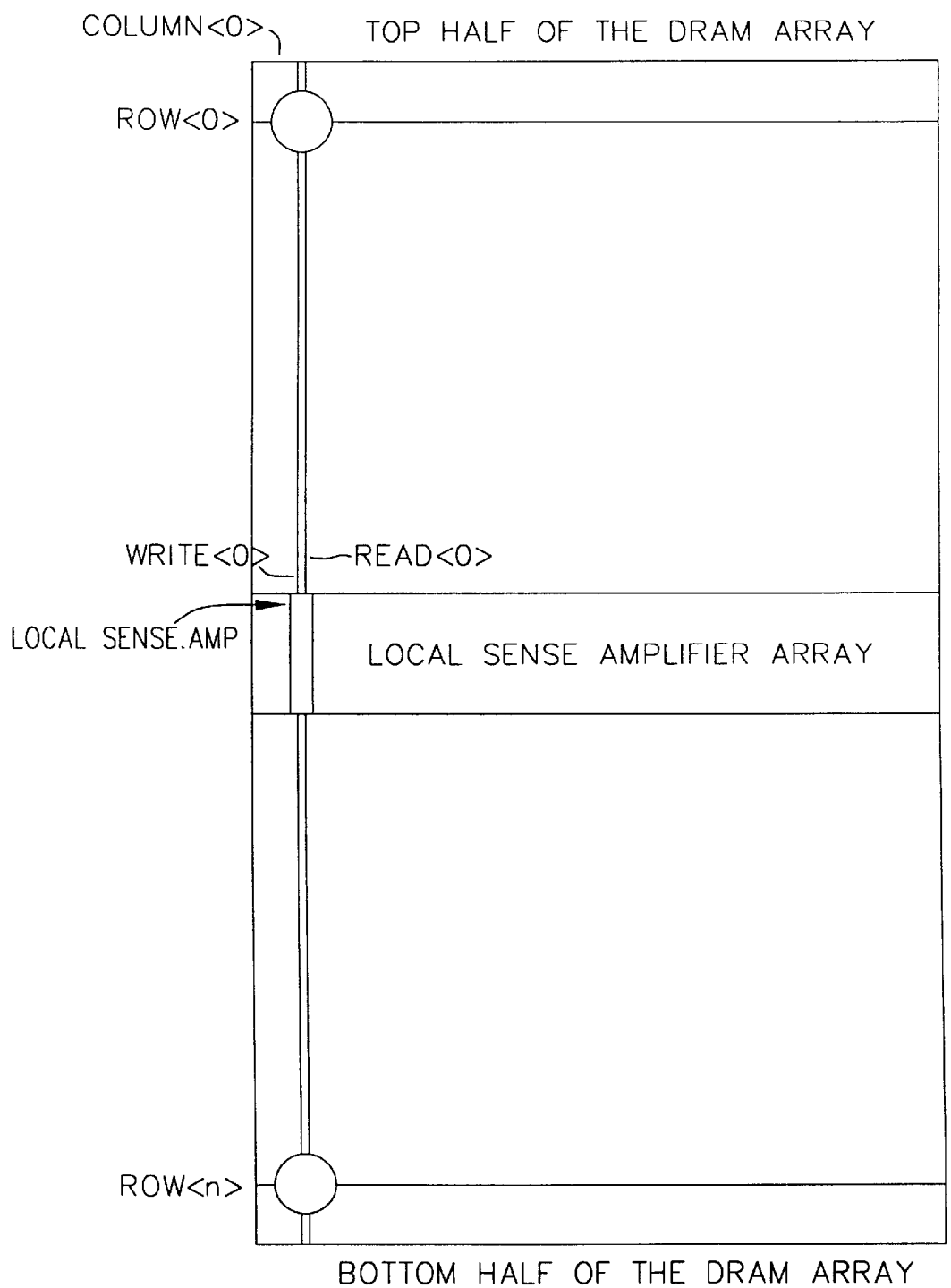
FIG. 6 is an exemplary block diagram of a hierarchical memory module, according to one embodiment of the present invention.

FIG. 6 is an exemplary architectural arrangement according to one embodiment of the present invention. In this architecture, the DRAM arrays are divided into top and bottom halves similar to the arrangement of FIG. 5 (blocks 410a and 410b, and 410c and 410d, respectively). The top and bottom columns are identical copies of each other and are positioned such that all bit lines align. A sense amplifier array is placed in the middle of the DRAM array and is shared between the top and bottom columns of the memory array. Each sense amplifier in the sense amplifier array is shared by a respective bit line in the top memory array and a respective bit line in the bottom memory array.

Figure 7A:
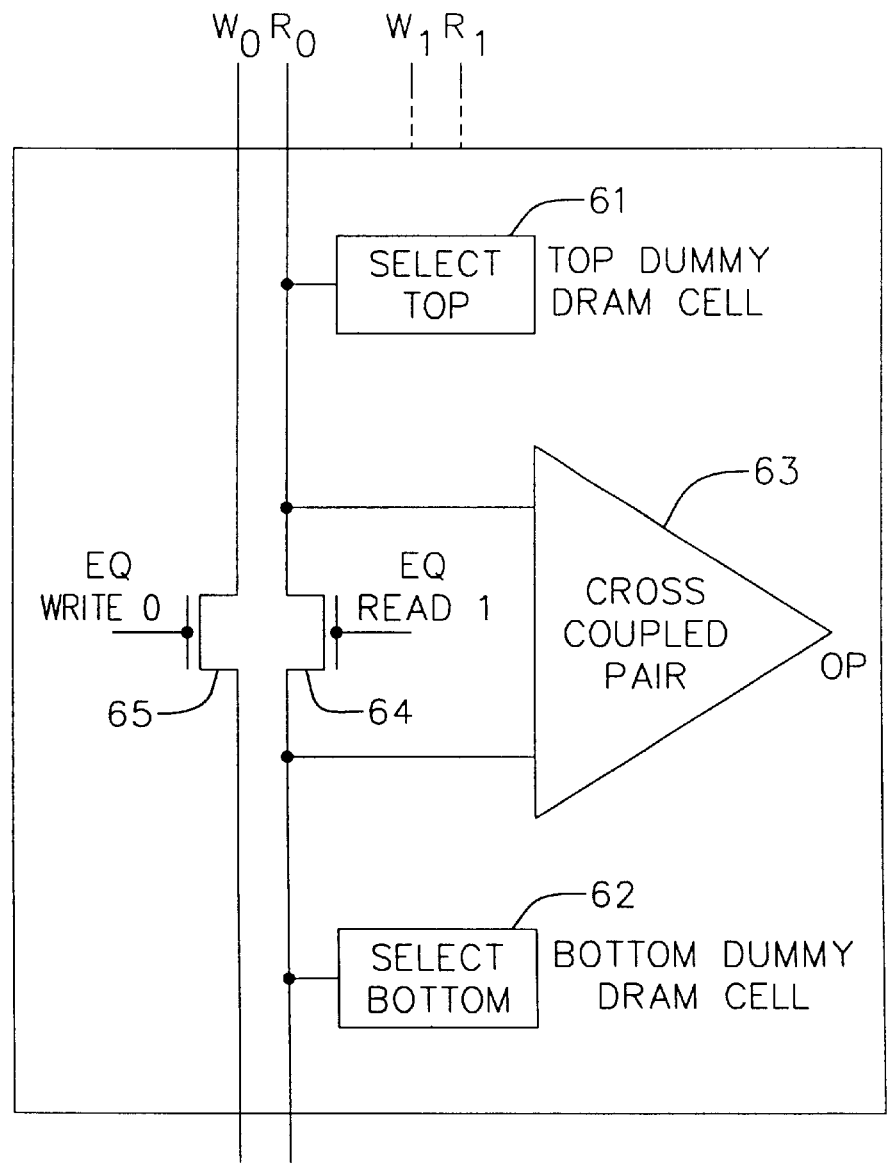
FIG. 7A is an exemplary block diagram of a hierarchical memory module using a first replica cell and a second replica cell for differential sensing of an accessed bit line, according to one embodiment of the present invention.

Each sense amplifier contains two dummy (replica) DRAM cells with half the drive strength of a memory data cell, a top dummy cell 61 and a bottom dummy cell 62, as shown in FIG. 7A. The dummy cells perform the function of generating a Vref that tracks process and temperature variations of the data cell. In the case of a 3-T cell, the dummy cells are replicas of a 3-T memory cell with half the drive capability. In the case of a 1-T cell, the dummy cells are a replica of a 1-T memory cell with half the capacitance and thus half the drive capability. Depending on the design preferences, the driving capability of the dummy cells may be a portion of the driving capability of data cell, other than one-half.

During pre-charge period read/write bit lines are connected to Vdd. If an access is requested from the top column of the array, the bottom dummy cell is selected and turned on, resulting in discharging the bottom read bit line at half (or a portion of) the rate of the accessed cell discharging its respective bit line. The accessed cell discharges the top read bit line at a rate proportional to the data stored in the accessed cell. The sense amplifier compares between the top read bit line driven by the accessed cell, and the bottom read bit line driven by the bottom dummy cell, to make a decision. Since the bottom read bit line is driven with half (or a portion) driving capability of the top bit line, it behaves as a reference voltage at the midpoint (or between) of a high and a low logic.

Preferably, all transistors are in the same orientation and use same layout rules. The top and bottom read bit lines serve as replica of each other with the same metal and diffusion capacitance. Because the dummy cell is made to be a replica of the data cells with one-half the drive strength and the bottom bit line tracks the top bit line with respect to temperature and process variations, this reference voltage tracks the temperature and process variations of the DRAM. As a result, this arrangement provides a superior temperature and process tracking.

Figure 7B:
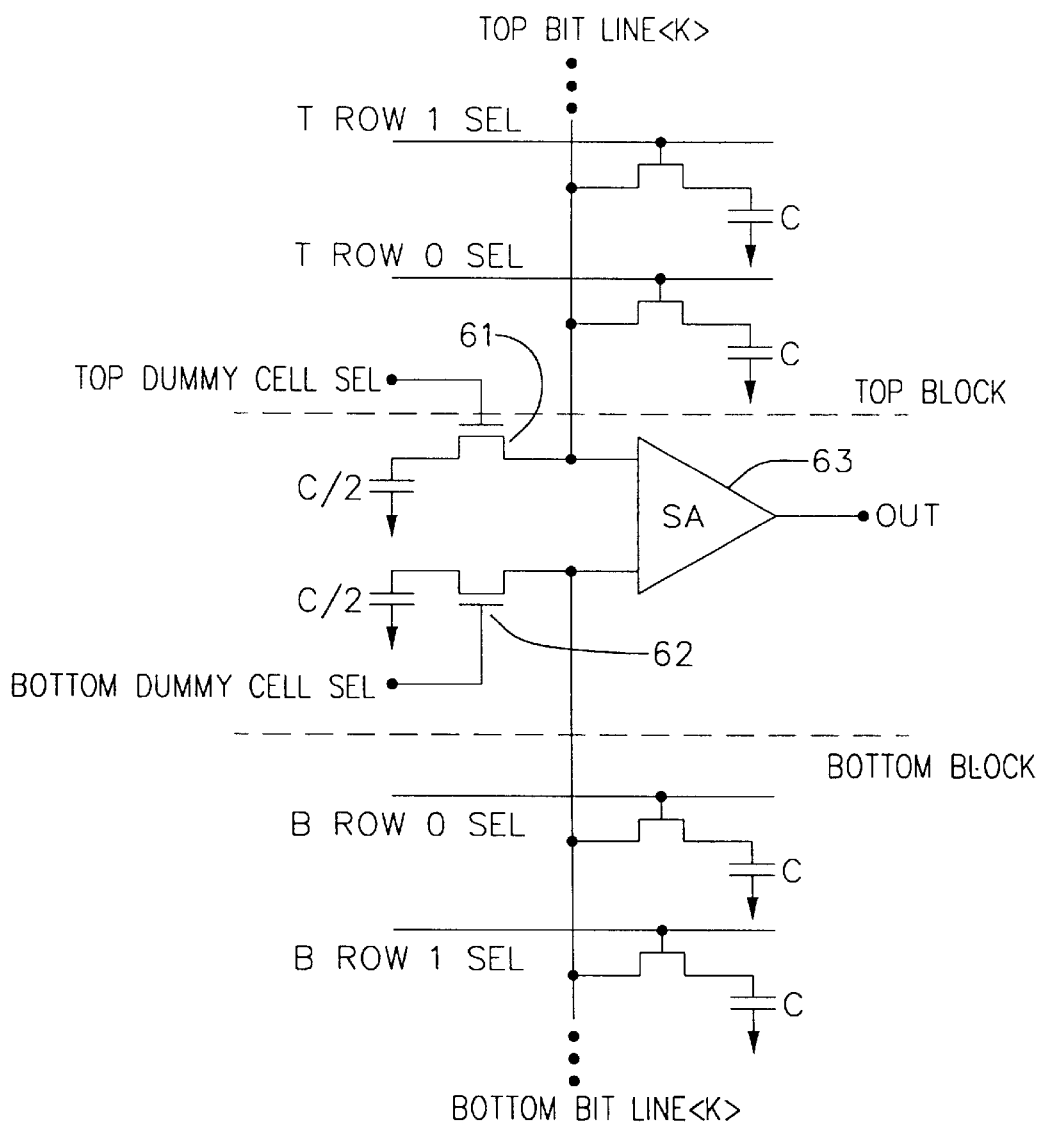
FIG. 7B is an exemplary block diagram of a hierarchical 1-T memory module using a first replica cell and a second replica cell for differential sensing of an accessed bit line, according to one embodiment of the present invention.

FIG. 7B is an exemplary block diagram of a memory arrangement with a 1-T cell structure, according to one embodiment of the present invention. In operation, if top row 0 is being accessed, top row 0 line turns on and takes control of the local bit line. Subsequently, row 0 of the bottom block is turned on by turning on the bottom dummy cell. The top bit line capacitance is identical to the bottom bit line capacitance. Moreover, the top bit line and the bottom bit line will see the same process variations and the same capacitance coupling.

Similar to FIG. 7A, the differential sense amplifier looks at the upper bit line and the lower bit line. The bottom dummy cell which is identical to the top data cell but has half the capacitance, provides a mid-point reference voltage to the differential sense amplifier that tracks any variations in the data cell. If the data cell charge (voltage) is larger than the charge of the dummy cell, the sense amplifier outputs a logic high. Likewise, if the data cell charge (voltage) is smaller than the charge of the dummy cell, the sense amplifier outputs a logic low. The dummy cell is basically a mirror image of each data cell and is close in proximity to the respective data cells so that it would track all the process and temperature variations. Although top/bottom arrangement of the memory module is used as an example to describe aspects of the present invention, other arrangements such as left/right, or other symmetrical arrangement are possible.

Figure 8A:
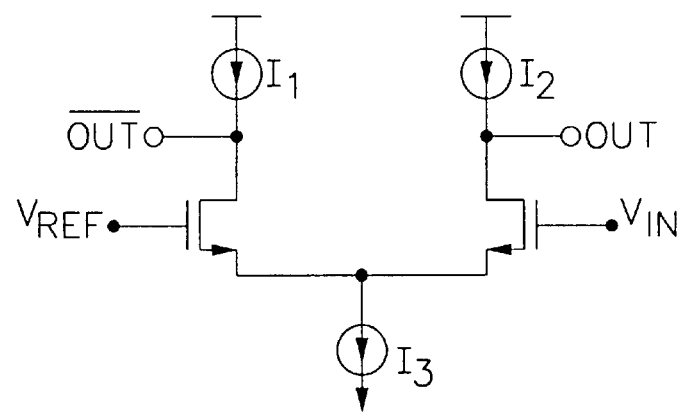
FIG. 8A is an exemplary simplified circuit for a differential sense amplifier, according to one embodiment of the present invention.
Figure 8B:
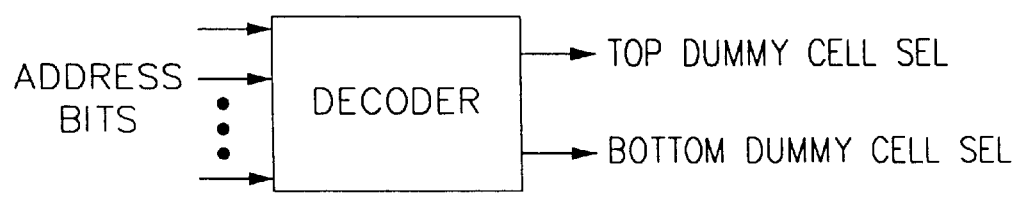
FIG. 8B is an exemplary selection logic for the replica cells, according to one embodiment of the present invention.

FIG. 8A is an exemplary simplified circuit for a differential sense amplifier. The drains of the two NMOS transistors M1 and M2 are driven by two respective current sources I1 and I2. The Sources of M1 and M2 are tied together and to a current sink I3. A reference voltage Vref is applied to the gate of M1 while the input voltage Vin is applied to the gate of M2. The difference between Vin and Vref is amplified at Out. Differential amplifier designs are well known in the art. FIG. 8B is an exemplary selection logic for the dummy cells. When any of the top cells within a column is selected, the output of the selection logic turns on the bottom dummy cell. Conversely, when any of the bottom cells within a column is selected, the output of the selection logic turns on the top dummy cell.

Figure 9:
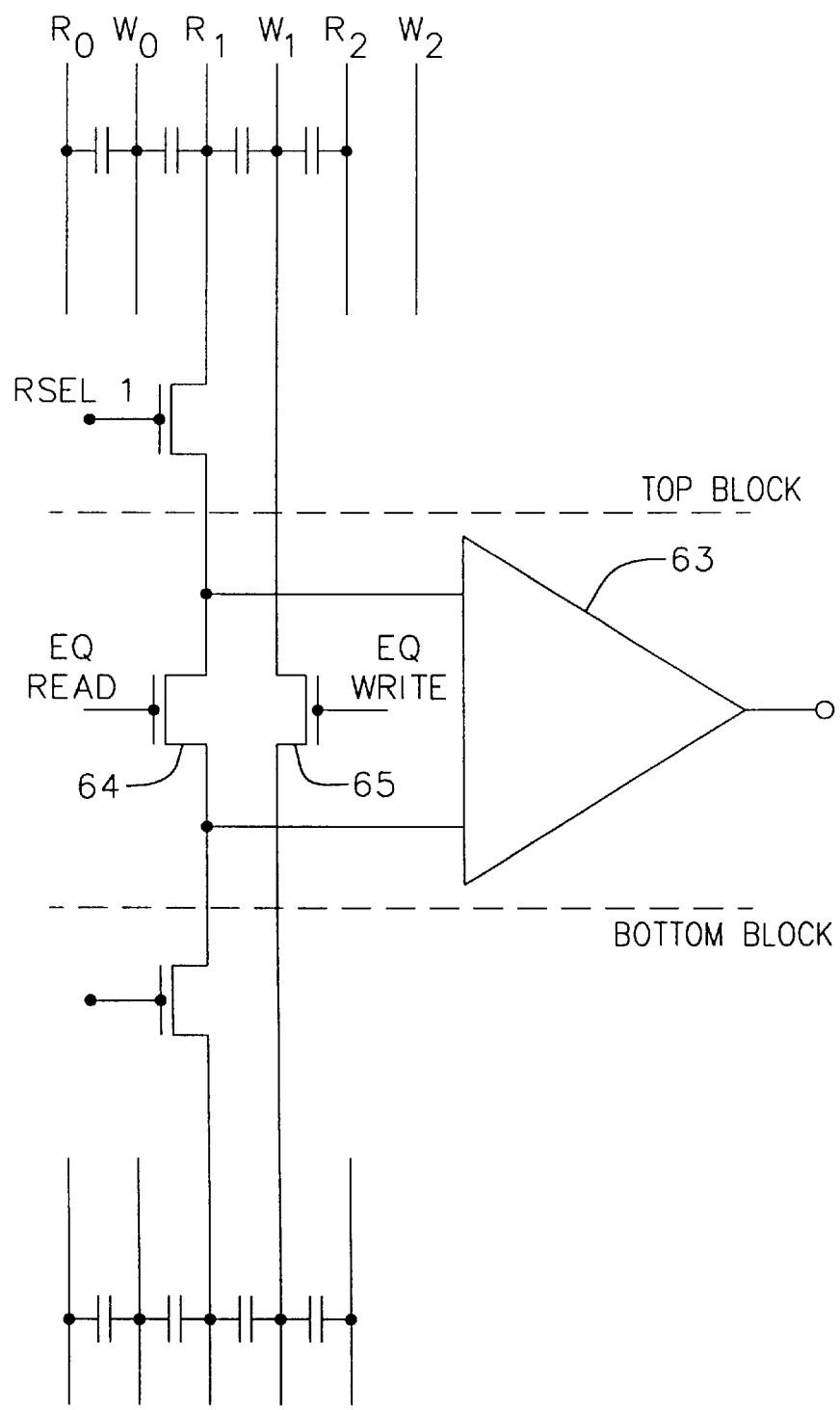
FIG. 9 is an exemplary block diagram of a hierarchical memory module including a write bit line equalization switch and a read bit line equalization switch.

Referring back to FIG. 7A, in one embodiment, in the case of a 3-T cell, the sense amplifier 63 includes a write bit line equalization switch 65 and a read bit line equalization switch 64. Due to the close proximity of the read and write bit lines, shown in FIG. 9, read bit lines couple significantly to write bit lines and through write bit lines to adjacent read bit lines. This coupling is data dependent and has different distribution between top and bottom portions of the array. To combat this problem, write equalization switch 65 is added which turns on during read operation to equalize top and bottom write bit lines. In other words, during a read cycle, the top write bit line is connected to the bottom write bit line. As a result, the coupling of the top read line is also reflected in the bottom read line. By introducing this switch most of the coupling becomes common mode and filters through the deferential sense amplifier, giving rise to robust data independent sense margin.

In one embodiment, a read equalization switch 64 (shown in FIG. 7A) is added for performing equalization of the top read line and the bottom read line before a read cycle. By turning the read equalization switch 64 on, the capacitance of the top read line and the capacitance of the bottom read line come to the same voltage before the read cycle. This results in a reference voltage for the sense amplifier that follows the input voltage to the amplifier and has the same voltage variation of the input. The common mode error is then rejected by the differential amplifier, resulting in a more accurate output. This read equalization scheme may be used for both 1-T and 3-T implementations.

Figure 10:
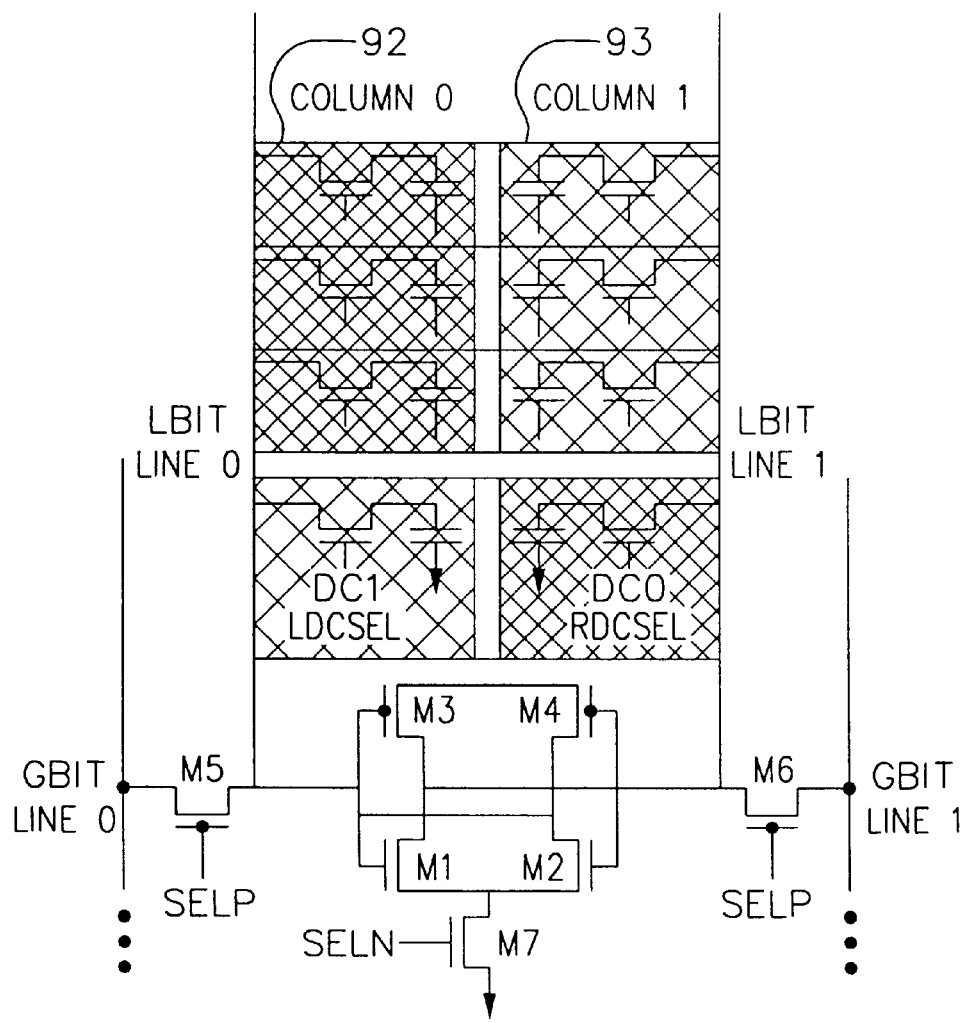
FIG. 10 is an exemplary simplified schematic of a local sense amplifier shared by two adjacent memory columns with a 1-T cell structure, according to one embodiment of the present invention.

FIG. 10 is an exemplary simplified schematic of a local sense amplifier shared by two adjacent memory columns with a 1-T cell structure, according to one embodiment of the present invention. In this embodiment, the differential sense amplifier 91 is placed between and is shared by two adjacent memory columns 92 and 93. The Local bit line0 (LbitLine0) reads a respective memory cell from column 0 and feeds the charge (voltage) to the sense amplifier 91. The output of the sense amplifier 91 is connected to global bit line0 (GbitLine0) through the PMOS transistor M5. The charge (voltage) on the GbitLine0 is then sensed by another sense amplifier (not shown) before it is output from the DRAM.

In one embodiment, the sense amplifier 91 includes two NMOS transistors M1 and M2 and two PMOS transistors M3 and M4 configured as a latch. The two PMOS transistors M5 and M6 driven by the Selp signal behave as a gate between the respective local bit lines to the respective global bit lines. The NMOS transistor M7 driven by the Seln signal drives the sources of M1 and M2 to ground when Seln is on to provide better voltage swing for the sense amplifier 91. This single transistor current sink, as part of the sense amplifier, provides layout flexibility and scalability and better voltage swing and speed. The two dummy cells DC0 and DC1, with half the drive capabilities are positioned opposite to their respective columns. When LBitLine0 is selected, RDS Sel signal is turned on to turn the DC0 on, driving Lbitline1 low with half driving capability of a memory cell. Similarly, when LBitLine1 is selected, LDS Sel signal is turned on to turn the DC1 on, driving Lbitline0 low with half driving capability of a memory cell.

The local bit lines are at a high ("1") voltage level when they are not being driven. In operation, when LbitLine0 is reading a 0 from a respective memory cell, the cell capacitor of that memory cell drives the Lbitline0 low, while DC0, with half drive capability drives LbitLine1 to a low voltage at half the voltage development. The LbitLine0 drives one input of the sense amplifier 91 low, while the other input LbitLine1 is being driven low at a lower rate. The latch configuration of the sense amplifier reinforces the voltage difference between the LbitLine0 and LbitLine1 and outputs a high voltage at the output, i.e., input to M5. A short time later (e.g., several hundred pico seconds), the Selp signal turns on which in turn, turns on the PMOS transistor M5, connecting the GbitLine0 to LbitLine0. The sense amplifier remains on during this operation to provide the necessary charge for the GBitline0 development and swing.

Because of the threshold voltage of M5, GbitLine0 does not go all the way down. In one implementation, the voltage of GbitLine0 goes down only by about 200 mV. Because GbitLine0 does not have to go through a full voltage swing, this design results in saving of power and a faster response time.

When LbitLine0 is reading a 1 from a respective memory cell, the Lbitline0 remains at a high voltage level, while DC0, with half drive capability drives LbitLine1 to 0. The LbitLine0 drives one input of the sense amplifier 91 high, while the other input LbitLine1 is being driven low by the DC0. The latch configuration of the sense amplifier reinforces the voltage difference between the LbitLine0 and LbitLine1 and outputs a low voltage at the output, i.e., input to M5. Again, a short time later (e.g., several hundred pico seconds), the Selp signal turns on which in turn, turns on the PMOS transistor M5, connecting the GbitLine0 to LbitLine0.

Because of the voltage drop across the drain and source of M5, GbitLine0 does not go all the way up. In one implementation, the voltage of GbitLine0 goes high only by about 200 mV. Because GbitLine0 does not have to go through a full voltage swing, this design results in saving of power and a faster response time. In one implementation, the power consumption and speed are improved by a factor of ten.

The power and speed improvement of this design also works for a write cycle. When a memory cell is being written to, the global bit lines which typically have a high capacitance do not have to go through a full voltage swing, resulting in saving of power and a faster response time. During the write cycle, the sense amplifier senses the limited voltage swing on the global bit lines and outputs a higher voltage swing to the respective local bit line to be written to the respective memory cell. Therefore, the relative simple design of the 4-transistor sense amplifier of FIG. 10 is augmented with the two PMOS transistors M5 and M6 to provide a fast and efficient sense amplifier that limits the voltage swing in the respective global bit lines for both read and write cycles.

Figure 11A:
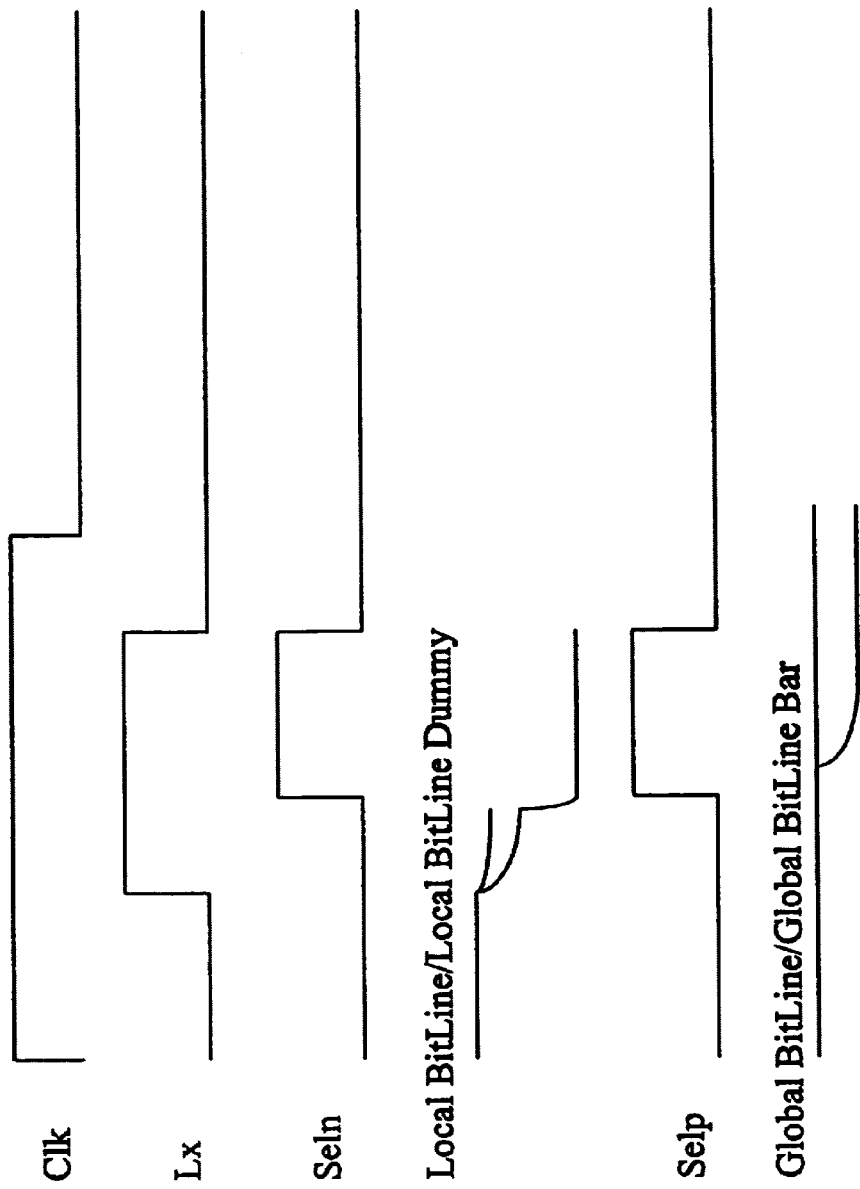

FIG. 11A is an exemplary timing diagram for a read operation, according to one embodiment of the present invention. As shown, at the rising edge of the clock and after address decoding, the driver of a respective local decoder turns on by signal LX. After the local decoder activation, a selected DRAM cell transfers its charges to the respective local bit line creating a voltage development on the respective local bit line. Simultaneously, a dummy DRAM cell transfers its charges to local bit line dummy creating a voltage development. After a set delay, the respective sense amplifier turns on by signal Seln to amplify the voltage difference between local bit line development and local bit line dummy development. The difference between the two voltages is the data read.

In the process of amplifying the difference, the sense amplifier creates a full swing voltage on the local bit lines to refreshe the DRAM cell just read. After a set delay and after the Local drivers de-activation, a global switch turns on by the signal Sel, connecting the sense amplifier to the respective global bit lines. The sense amplifier provides charges to the respective global bit line to create voltage swing on the global bit line. A PMOS device threshold voltage limits the voltage swing on the global bit lines to save power and enhance speed.

FIG. 11B is an exemplary timing diagram for a write operation, according to one embodiment of the present invention. As shown, shortly after the clock edge, the data to be written is placed on the respective global bit lines in the form of limited voltage swing. After address decoding, signal Selp activates to allow the global bit line limited swing voltage to be transferred to the respective sense amplifier. After a fixed delay, the sense amplifier activates amplifying the limited swing signal and the local driver activates simultaneously. The amplified signal is then written to the selected DRAM cell.

FIG. 11C is an exemplary timing diagram for a refresh operation, according to one embodiment of the present invention. As shown, the refresh operation is similar to read operation, except that the Selp signal is not activated to save power and speed and allow for multiple refresh operations.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope of the invention as defined by the claims.

What is claimed is:

1. A DRAM with differential sensing means comprising:
   a top block of data cells including a plurality of data cell subsets, wherein each of the data cell subsets is coupled to a respective top bit line;
   a bottom block of data cells including a plurality of data cell subsets, wherein each of the data cell subsets is coupled to a respective bottom bit line;
   a plurality of sense amplifiers positioned between the top block of data cells and the bottom block of data cells, each sense amplifier of the plurality of sense amplifiers is shared by a respective top bit line and a respective bottom bit line;
   a first replica memory cell with a maximum driving strength of a portion of driving strength of each of the data cells in the top block and the bottom block of data cells, wherein when a first data cell in the top block is accessed, the first replica memory cell turns on to discharge a first respective bottom bit line at a portion of a discharge rate of a first respective top bit line driven by the accessed first data cell, and a first respective sense amplifier compares the charge on the first respective top bit line driven by the accessed first data cell and the charge on the first respective bottom bit line driven by the first replica memory cell to determine the state of the accessed data cell in the top block in response to portioned discharge rate of the first respective bottom bit line;
   a second replica memory cell with a maximum driving strength of a portion of driving strength of each of the data cells in the top block and the bottom block of data cells, wherein when a second data cell in the bottom block is accessed, the second replica memory cell turns on to discharge a second respective top bit line at a portion of a discharge rate of a second respective bottom bit line driven by the accessed second data cell, and a second respective sense amplifier compares the charge on the second respective bottom bit line driven by the accessed second data cell and the charge on the second respective top bit line driven by the second replica memory cell to determine the state of the accessed data cell in the bottom block in response to portioned discharge rate of the second respective top bit line; and
   a write equalization switch for equalizing a write bit line in the top block of data cells with a respective write bit line in the bottom block of data cells during a read cycle.

2. The DRAM of claim 1, wherein the portion of driving strength of the first replica memory cell and the second replica memory cell is one-half of driving strength of each of the data cells in the top block and the bottom block of data cells.

3. The DRAM of claim 1, wherein each data cell in the top block and the bottom block of data cells comprises of three transistors.

4. The DRAM of claim 1, wherein each data cell in the top block and the bottom block of data cells uses same layout rules.

5. The DRAM of claim 1, wherein each respective top bit line and each respective bottom bit line have same diffusion capacitance.

6. The DRAM of claim 1, further comprising a read equalization switch for coupling a read line in the top block of data cells with a respective read line in the bottom block of data cells before a read cycle.

7. The DRAM of claim 1, wherein each shared sense amplifier includes a transistor gate coupled between a respective local bit line and a respective global bit line for limiting voltage swing on the respective global bit line for read and write cycles.

8. A method for differential sensing of a DRAM comprising the steps of:
   arranging the DRAM in a top block of data cells including a plurality of data cell subsets, wherein each of the data cell subsets in the top block is coupled to a respective top bit line, and a bottom block of data cells including a plurality of data cell subsets, wherein each of the data set subsets in the bottom block is coupled to a respective bottom bit line;
   positioning a plurality of sense amplifiers between the top block of data cells and the bottom block of data cells, each sense amplifier of the plurality of sense amplifiers is shared by a respective top bit line and a respective bottom bit line;
   when a first data cell in the top block is accessed, activating a first replica memory cell with a maximum driving strength of a portion of driving strength of each of the data cells in the top block and the bottom block of data cells for discharging a first respective bottom bit line at a portion of a discharge rate of a first respective top bit line driven by the accessed first data cell, and comparing the charge on a first respective top bit line driven by the accessed first data cell and the charge on the first respective bottom bit line driven by the first replica memory cell by a first respective sense amplifier to determine the state of the accessed data cell in the top block in response to portioned discharge rate of the first respective bottom bit line;
   when a second data cell in the bottom block is accessed, activating a second replica memory cell a maximum driving strength of a portion of driving strength of each of the data cells in the top block and the bottom block of data cells for discharging a second respective top bit line at a portion of a discharge rate of a second respective bottom bit line driven by the accessed second data cell, and comparing the charge on a second respective bottom bit line driven by the accessed second data cell and the charge on the second respective top bit line driven by the second replica memory cell by a second respective sense amplifier to determine the state of the accessed data cell in the bottom block in response to portioned discharge rate of the second respective top bit line; and
   equalizing a write bit line in the top block of data cells with a respective write bit line in the bottom block of data cells during a read cycle.

9. The method of claim 8, wherein the portion of driving strength of the first replica memory cell and the second replica memory cell is one-half of driving strength of each of the data cells in the top block and the bottom block of data cells.

10. The method of claim 8, wherein each data cell in the top block and the bottom block of data cells comprises of three transistors.

11. The method of claim 8, wherein each data cell in the top block and the bottom block of data cells uses same layout rules.

12. The method of claim 8, wherein each respective top bit line and each respective bottom bit line have same diffusion capacitance.

13. The method of claim 8, further comprising the step of coupling a read line in the top block of data cells with a respective read line in the bottom block of data cells before a read cycle for read cycle equalization.

14. The method of claim 8, further comprising the step of limiting voltage swing on the respective global bit line for read and write cycles by a transistor gate coupled between a respective local bit line and a respective global bit line.

15. A DRAM comprising:
a first block of data cells including a plurality of data cell arrays, wherein each of the data cell arrays includes a plurality of data cells;
a second block of data cells including a plurality of data cell arrays, wherein each of the data cell arrays includes a plurality of data cells;
a sense amplifier array positioned between the first block of data cells and the second block of data cells, each sense amplifier in the sense amplifier array is shared by a respective data cell array in the first block and a respective data cell array in the second block;
a first replica memory cell with a maximum driving strength of a portion of driving strength of each of the data cells in the first block and the second block of data cells, wherein when a first data cell in the first block is accessed, the first replica memory cell discharges a first respective bit line in the second block, and a first respective sense amplifier compares the charge on a first respective bit line in the first block driven by the accessed first data cell and the first respective bit line in the second block driven by the first replica memory cell to determine the state of the accessed data cell in the first block in response to portioned discharge rate of the first respective bottom bit line in the second block;
a second replica memory cell with a maximum driving strength of a portion of driving strength of each of the data cells in the first block and the second block of data cells, wherein when a second data cell in the second block is accessed, the second replica memory cell discharges a second respective bit line in the first block, and a second respective sense amplifier compares the charge on a second respective bit line in the second block driven by the accessed second data cell and the second respective bit line in the first block driven by the second replica memory cell to determine the state of the accessed data cell in the second block in response to portioned discharge rate of the second respective bit line in the first block; and
a write equalization switch for equalizing a write bit line in the top block of data cells with a respective write bit line in the bottom block of data cells during a read cycle.

16. The DRAM of claim 15, wherein the portion of driving strength of the first replica memory cell and the second replica memory cell is one-half of driving strength of each of the data cells in the first block and the second block of data cells.

17. The DRAM of claim 15, wherein each data cell in the first block and the second block of data cells comprises of three transistors.

18. The DRAM of claim 15, wherein each data cell in the first block and the second block of data cells uses same layout rules.

19. The DRAM of claim 15, further comprising a read equalization switch for coupling a read line in the top block of data cells with a respective read line in the bottom block of data cells before a read cycle.

20. The DRAM of claim 15, wherein each shared sense amplifier includes a transistor gate coupled between a respective local bit line and a respective global bit line for limiting voltage swing on the respective global bit line for read and write cycles.

21. A method for differential sensing of a hierarchical DRAM including a first block of data cells comprising a plurality of data cell arrays, and a second block of data cells comprising a plurality of data cell arrays, each of the data cell arrays includes a plurality of data cells, and a sense amplifier array positioned between the first block of data cells and the second block of data cells, each sense amplifier in the sense amplifier array shared by a respective data cell array in the first block and a respective data cell array in the second block, the method comprising the steps of:
when a first data cell in the first block is accessed, activating a first replica memory cell with a maximum driving strength of a portion of driving strength of each of the data cells in the first block and the second block of data cells for discharging a first respective bit line in the second block and comparing the charge on a first respective bit line in the first block driven by the accessed first data cell and the first respective bit line in the second block driven by the first replica memory cell with the portion driving capability of the accessed first data cell by a first respective sense amplifier to determine the state of the accessed data cell in the first block in response to portioned discharge rate of the first respective bottom bit line in the second block;
when a second data cell in the second block is accessed, activating a second replica memory cell with a maximum driving strength of a portion of driving strength of each of the data cells in the first block and the second block of data cells for discharging a second respective bit line in the first block and comparing the charge on a second respective bit line in the second block driven by the accessed second data cell and the second respective bit line in the first block driven by the second replica memory cell with the portion driving capability of the accessed second data cell by a second respective sense amplifier to determine the state of the accessed data cell in the second block in response to portioned discharge rate of the second respective bit line in the first block; and
equalizing a write bit line in the top block of data cells with a respective write bit line in the bottom block of data cells during a read cycle.

22. The method of claim 21, wherein the portion of driving strength of the first replica memory cell and the second replica memory cell is one-half of driving strength of each of the data cells in the first block and the second block of data cells.

23. The method of claim 21, further comprising the step of coupling a read line in the top block of data cells with a respective read line in the bottom block of before a read cycle.

24. The method of claim 21, further comprising the step of limiting voltage swing on the respective global bit line for read and write cycles by a transistor gate coupled between a respective local bit line and a respective global bit line.

25. A DRAM comprising:
- a first block of data cells including a plurality of data cell arrays, wherein each of the data cell arrays includes a plurality of data cells;
- a second block of data cells including a plurality of data cell arrays, wherein each of the data cell arrays includes a plurality of data cells;
- a sense amplifier array positioned between the first block of data cells and the second block of data cells, each sense amplifier in the sense amplifier array is shared by a respective data cell array in the first block and a respective data cell array in the second block;
- first means for discharging a first respective bit line in the second block and comparing the charge on a first respective bit line in the first block driven by an accessed first data cell in the first block and the charge on the first respective bit line in the second block driven by a first replica memory cell with a maximum driving strength of a portion driving strength of the accessed first data cell by a first respective sense amplifier to determine the state of the accessed data cell in the first block in response to portioned discharge rate of the first respective bottom bit line in the second block;
- second means for discharging a second respective bit line in the first block and comparing the charge on a second respective bit line in the second block driven by an accessed second data cell in the second block and the charge on the second respective bit line in the first block driven by a second replica memory cell with a maximum driving strength of a portion driving strength of the accessed second data cell by a second respective sense amplifier to determine the state of the accessed data cell in the second block in response to portioned discharge rate of the second respective bit line in the first block; and
- a write equalization means for equalizing a write bit line in the top block of data cells with a respective write bit line in the bottom block of data cells during a read cycle.

26. The DRAM of claim 25, wherein each data cell in the first and second blocks of data cells comprises of three transistors.

27. The DRAM of claim 25, wherein each data cell in the first and second blocks of data cells uses same layout rules.

28. The DRAM of claim 25, further comprising a read equalization means for coupling a read line in the top block of data cells with a respective read line in the bottom block of data cells before a read cycle.

29. The DRAM of claim 25, wherein each shared sense amplifier includes a transistor gate coupled between a respective local bit line and a respective global bit line for limiting voltage swing on the respective global bit line for read and write cycles.

* * * * *